(12) United States Patent
Zhang et al.

(10) Patent No.: US 9,462,722 B2
(45) Date of Patent: Oct. 4, 2016

(54) ELECTRONIC DEVICE

(71) Applicants: HONG FU JIN PRECISION INDUSTRY (ShenZhen) CO., LTD, Shenzhen (CN); HON HAI PRECISION INDUSTRY CO., LTD., New Taipei (TW)

(72) Inventors: Guang-Yi Zhang, Shenzhen (CN); Bing-Bao Guo, Shenzhen (CN)

(73) Assignees: HONG FU JIN PRECISION INDUSTRY (ShenZhen) CO., LTD., Shenzhen (CN); HON HAI PRECISION INDUSTRY CO., LTD., New Taipei (TW)

( * ) Notice: Subject to any disclaimer, the term of this patent is extended or adjusted under 35 U.S.C. 154(b) by 20 days.

(21) Appl. No.: 14/662,408

(22) Filed: Mar. 19, 2015

(65) Prior Publication Data

US 2015/0271947 A1    Sep. 24, 2015

(30) Foreign Application Priority Data

Mar. 21, 2014    (CN) .......................... 2014 1 0106414

(51) Int. Cl.
*H05K 7/18*    (2006.01)
*H05K 7/14*    (2006.01)
*H05K 5/02*    (2006.01)

(52) U.S. Cl.
CPC .......... *H05K 7/1488* (2013.01); *H05K 5/0221* (2013.01); *H05K 7/18* (2013.01)

(58) Field of Classification Search
CPC ...... G06F 1/1656; G06F 1/185; G06F 1/186; G06F 1/184; G06F 1/181; G06F 1/187; G06F 1/1679; G06F 1/1632; G06F 1/1626; G06F 1/16; H05K 7/142; H05K 7/1417; H05K 3/284; H05K 5/0221; H05K 5/0226; H05K 7/1488; H05K 5/0217; H05K 7/16; H05K 7/18; H05K 5/0208; E05B 83/243; E05B 83/247; E05B 83/36
USPC ............ 361/679.01–679.39, 679.55–679.58, 361/679.33–679.39, 752; 312/223.1–223.2
See application file for complete search history.

(56) References Cited

U.S. PATENT DOCUMENTS 6,788,531 B2 * 9/2004 Chen ........................ H05K 7/14
                                                      211/26
9,173,309 B2 * 10/2015 Chen .................... H05K 5/0221

* cited by examiner

*Primary Examiner* — Anthony Haughton
*Assistant Examiner* — Ingrid Wright
(74) *Attorney, Agent, or Firm* — Zhigang Ma

(57) ABSTRACT

An electronic device includes a chassis, two opposite mounting brackets mounted to a front of the chassis, two latching apparatuses installed to the mounting brackets, and a panel. Each latching apparatus includes a latching member rotatably mounted in the corresponding mounting bracket, a first resilient member connected between the latching member and the mounting bracket for restoring the latching member, and an operating member rotatably mounted to the mounting bracket. The operating member can push the latching member to rotate. Two latching bars protrude out from two opposite ends of the panel. Each latching member includes a latching pole extending through the corresponding bracket. The panel is inserted between the mounting brackets. Each latching bar slidably abuts against the corresponding latching pole to rotate each latching member and deform the first resilient member, until the latching pole slides over the latching bar.

20 Claims, 8 Drawing Sheets

ELECTRONIC DEVICE

FIELD

The subject matter herein generally relates to an electronic device.

BACKGROUND

Electronic devices, such as servers, include a panel mounted to a side of a chassis of the electronic device.

BRIEF DESCRIPTION OF THE DRAWINGS

Implementations of the present technology will now be described, by way of example only, with reference to the attached figures.

DETAILED DESCRIPTION

Figure 1:
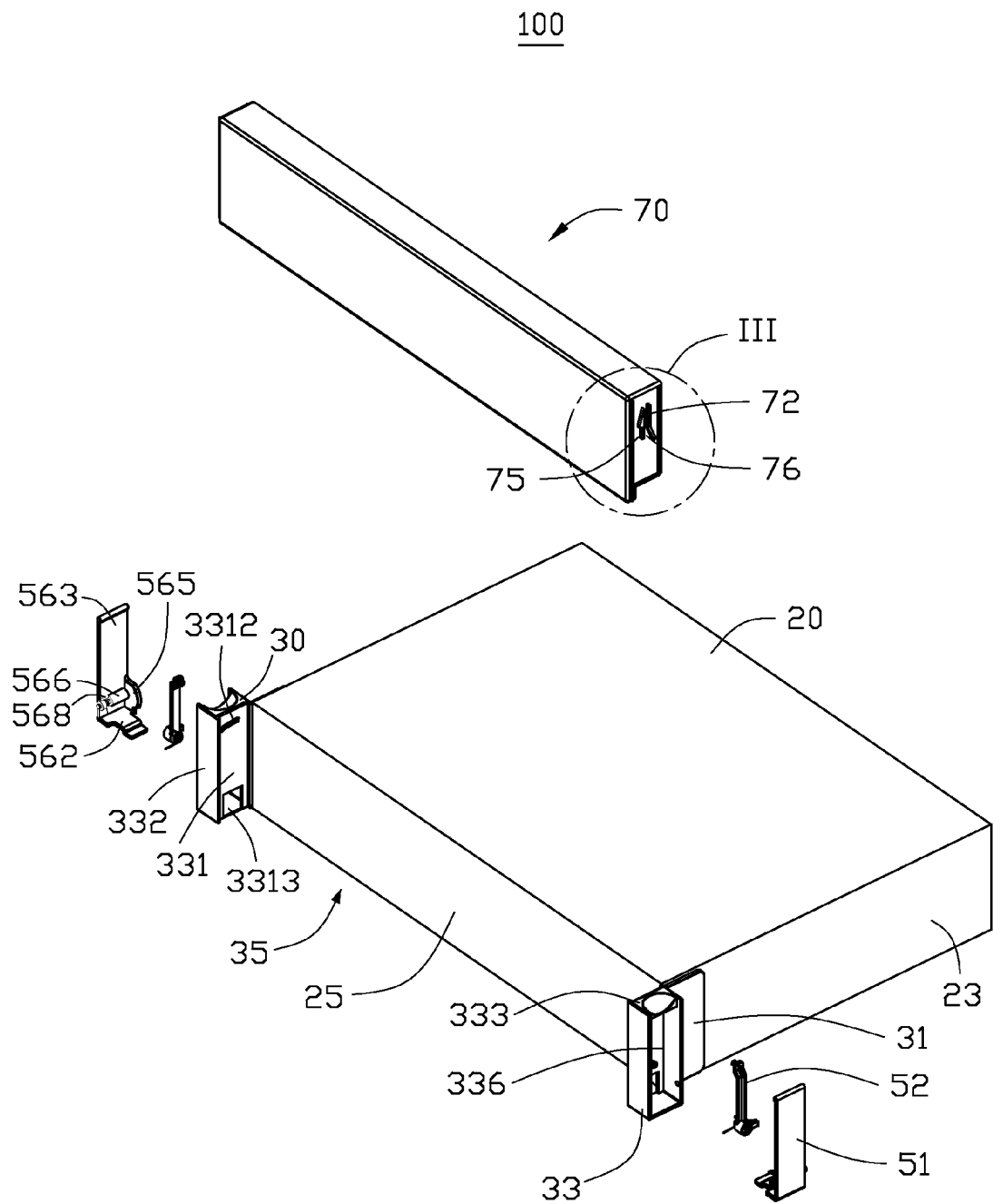
FIG. 1 is an exploded, isometric view of an embodiment of an electronic device.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures and components have not been described in detail so as not to obscure the related relevant feature being described. The drawings are not necessarily to scale and the proportions of certain parts may be exaggerated to better illustrate details and features. The description is not to be considered as limiting the scope of the embodiments described herein.

Several definitions that apply throughout this disclosure will now be presented.

The term "coupled" is defined as connected, whether directly or indirectly through intervening components, and is not necessarily limited to physical connections. The connection can be such that the objects are permanently coupled or releasably coupled. The term "substantially" is defined to be essentially conforming to the particular dimension, shape or other word that substantially modifies, such that the component need not be exact. For example, substantially cylindrical means that the object resembles a cylinder, but can have one or more deviations from a true cylinder. The term "comprising" means "including, but not necessarily limited to"; it specifically indicates open-ended inclusion or membership in a so-described combination, group, series and the like.

The present disclosure is described in relation to an electronic device.

Figure 2:
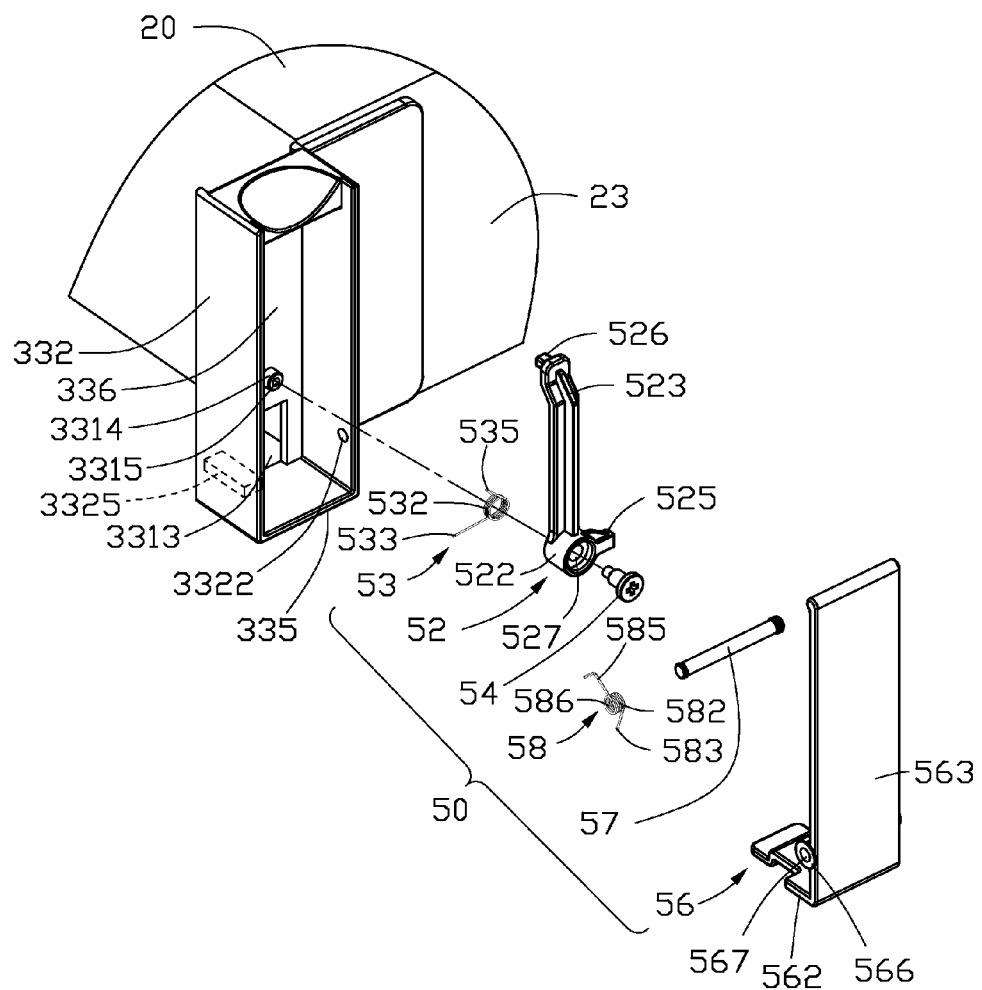
FIG. 2 is a partial, exploded, enlarged view of FIG. 1.

FIGS. 1 and 2 illustrate exploded, isometric views of an electronic device 100. The electronic device 100 comprises a substantially rectangular chassis 20, two mounting brackets 30 mounted to the chassis 20, two latching apparatuses 50, and a substantially rectangular panel 70. The chassis 20 comprises two side walls 23, and a front wall 25 coupled between front ends of the side walls 23. Each mounting bracket 30 is mounted to the front end of a corresponding side wall 23. In at least one embodiment, the chassis 20 is a server.

Each mounting bracket 30 comprises a mounting plate 31 mounted to the corresponding side wall 23, and a receiving shell 33 coupled to the mounting plate 31. Each receiving shell 33 can be positioned beyond the front end of the corresponding side wall 23, such that the receiving shells 33 can face each other. The receiving shells 33 and the front wall 25 cooperatively bound an installing space 35. Each receiving shell 33 comprises a coupling plate 331 substantially perpendicular to the front wall 25, two side plates 332 extending substantially perpendicularly from the coupling plate 331, a top plate 333 coupled between top portions of the side plates 332, and a bottom plate 335 coupled between bottom portions of the side plates 332. The coupling plate 331, the side plates 332, the top plate 333, and the bottom plate 335 cooperatively bound a receiving slot 336. An arc-shaped guiding slot 3312 is defined in an upper portion of the coupling plate 331, and a though hole 3313 is defined in a lower portion of the coupling plate 331. The guiding slot 3312 extends through the coupling plate 331. A coupling pole 3314 extends substantially perpendicularly from a substantially middle portion of the coupling plate 331 into the receiving slot 336. The coupling pole 3314 is located between the through hole 3313 and the guiding slot 3312. A distal end of the coupling pole 3314 axially defines a fastening hole 3315. A lower portion of each side plate 332 defines a mounting hole 3322. A block 3325 located adjacent to the corresponding mounting hole 3322 protrudes from one of the side plates 332 into the receiving slot 336.

Each latching apparatus 50 comprises a latching member 52, a first resilient member 53, a fastening member 54, an operating member 56, a shaft 57, and a second resilient member 58.

The latching member 52 comprises a substantially cylindrical rotating portion 522, and an extending pole 523 extending substantially perpendicularly from a circumference of the rotating portion 522. An adjusting plate 525 extends substantially perpendicularly from the circumference of the rotating portion 522, such that the adjusting plate 525 is substantially perpendicular to the extending pole 523. A latching pole 526 extends substantially perpendicularly from a distal end portion of the extending pole 523. The rotating portion 522 axially defines a shaft hole 527.

In at least one embodiment, the first resilient member 53 is a torsion spring. The first resilient member 53 comprises an annular main body 532, a first abutting pole 533, and a second abutting pole 535.

The operating member 56 is substantially L-shaped. The operating member 56 comprises a resisting plate 562, and an operating plate 563 extending substantially perpendicularly from an end portion of the resisting plate 562. An arc-shaped abutting piece 565 extends substantially perpendicularly from a lower portion of a side of the operating plate 563. A rotating pole 566 protrudes from the lower portion of the operating plate 563, and an end portion of the rotating pole 566 is connected to the abutting piece 565. The rotating pole 566 axially defines a rotating hole 567 extending through the abutting piece 565. The rotating pole 566 defines a cutout 568.

In at least one embodiment, the second resilient member 58 is a torsion spring. The second resilient member 58 comprises an annular main body 582, a first abutting pole 583, and a second abutting pole 585. The main body 582 axially defines a through hole 586.

Figure 3:
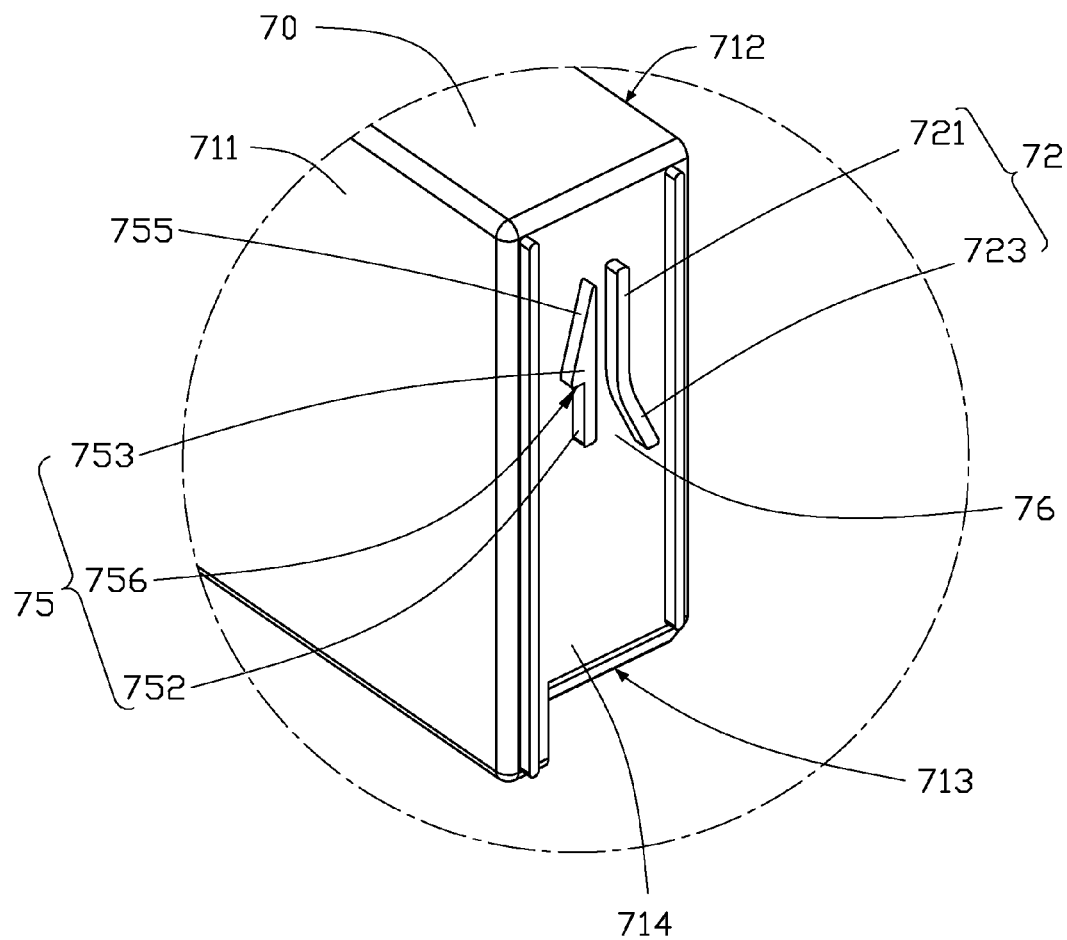
FIG. 3 is an enlarged view of circled portion III of FIG. 1.

Referring to FIG. 3, the panel 70 comprises a front surface 711, a rear surface 712 opposite to the front surface 711, a bottom surface 713 coupled between bottom sides of the front surface 711 and the rear surface 712, and two opposite end surfaces 714. A latching bar 72 and a positioning bar 75 protrude from each end surface 714. Each latching bar 72 is adjacent to the rear surface 712, and each positioning bar 75 is adjacent to the front surface 711. Each latching bar 72 and the corresponding positioning bar 75 cooperatively bound a sliding slot 76. Each latching bar 72 comprises a positioning portion 721 mounted to an upper portion of the corresponding end surface 714, and a guiding portion 723 slantingly extending from a bottom end of the positioning portion 721 toward the rear surface 712. Each positioning bar 75 comprises a coupling portion 752 substantially parallel to the positioning portion 721, and a substantially triangular latching portion 753 extending toward the front surface 711 from an upper end of the coupling portion 752. The latching portion 753 forms a slanted guiding surface 755, and an abutting surface 756 is formed between the guiding surface 755 and the coupling portion 752.

In assembly, the main body 532 of each first resilient member 53 is fitted about the corresponding coupling pole 3314. Each latching member 52 is received in the receiving slot 336 of the corresponding receiving shell 33, such that the latching pole 526 extends through the corresponding guiding slot 3312, and the shaft hole 527 of the rotating portion 522 aligns with the fastening hole 3315 of the coupling pole 3314. Each fastening member 54 extends through the shaft hole 527 of the corresponding latching member 52 and engages in the fastening hole 3315 of the corresponding coupling pole 3314. Thus, each latching member 52 is rotatably coupled to the corresponding coupling pole 3314, and each latching member 52 can rotate to move the corresponding latching pole 526 along the corresponding guiding slot 3312. The first abutting pole 533 of each first resilient member 53 abuts against the corresponding block 3325, and the second abutting pole 535 resiliently abuts against the corresponding extending pole 523, to drive the corresponding extending pole 523 to rotate the corresponding latching pole 526 toward the chassis 20 until the latching pole 526 is stopped by an end of the corresponding guiding slot 3312.

The main body 582 of each second resilient member 58 is received in the cutout 568 of the corresponding operating member 56 such that the first abutting pole 583 abuts against an inner surface of the corresponding operating plate 563, the second abutting pole 585 abuts against the corresponding block 3325, and the through hole 568 of the main body 582 is aligned with the rotating hole 567. Each operating member 56 is received in the receiving slot 336 of the corresponding receiving shell 33 such that the resisting plate 562 extends through the through hole 3313, the abutting piece 565 abuts against a bottom portion of the corresponding adjusting plate 525, and the rotating hole 567 aligns with the mounting holes 3322 of the corresponding receiving shell 33. Each shaft 57 extends through the mounting hole 3322 of one of the side plate 332 of the corresponding receiving shell 33, the rotating hole 567, and the corresponding second resilient member 58, and engages in the mounting hole 3322 of the other side plate 332 of the receiving shell 33.

Figure 4:
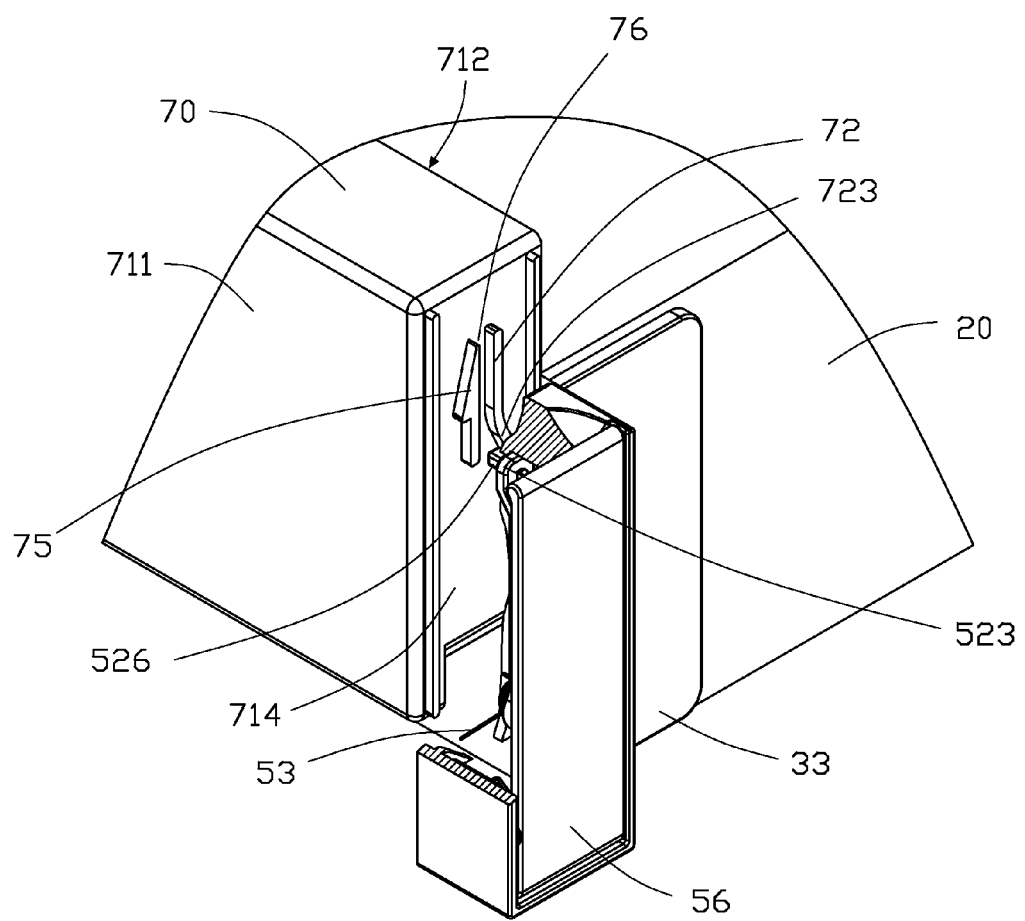
FIGS. 4-6 are isometric, cutaway views showing a process of assembling the electronic device.
Figure 5:
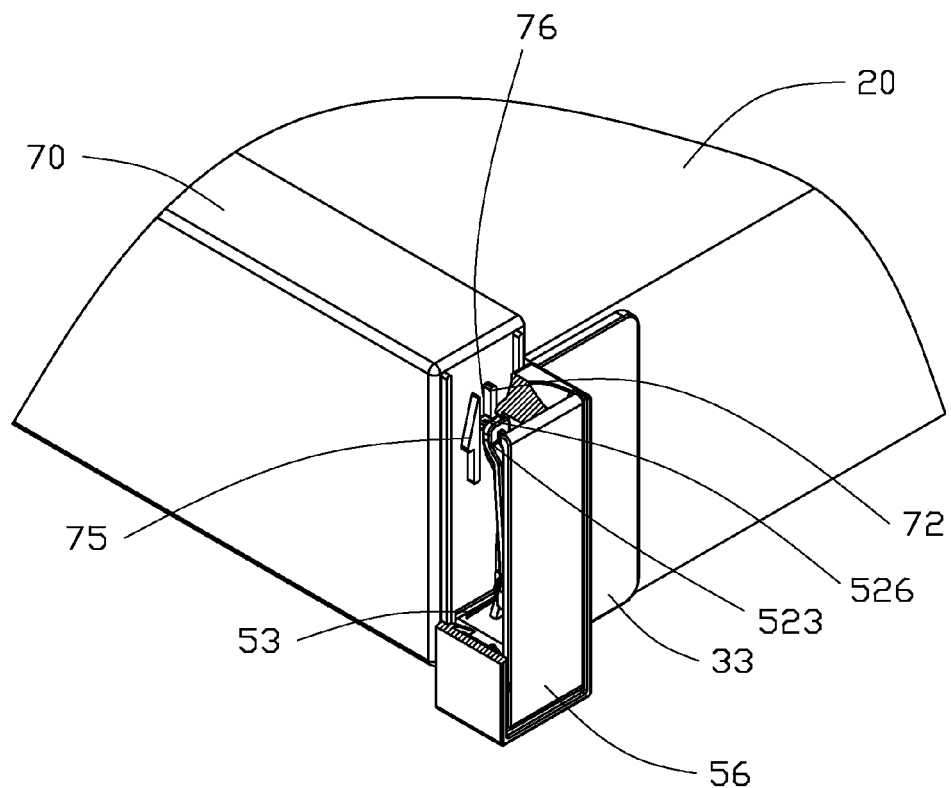
Figure 6:
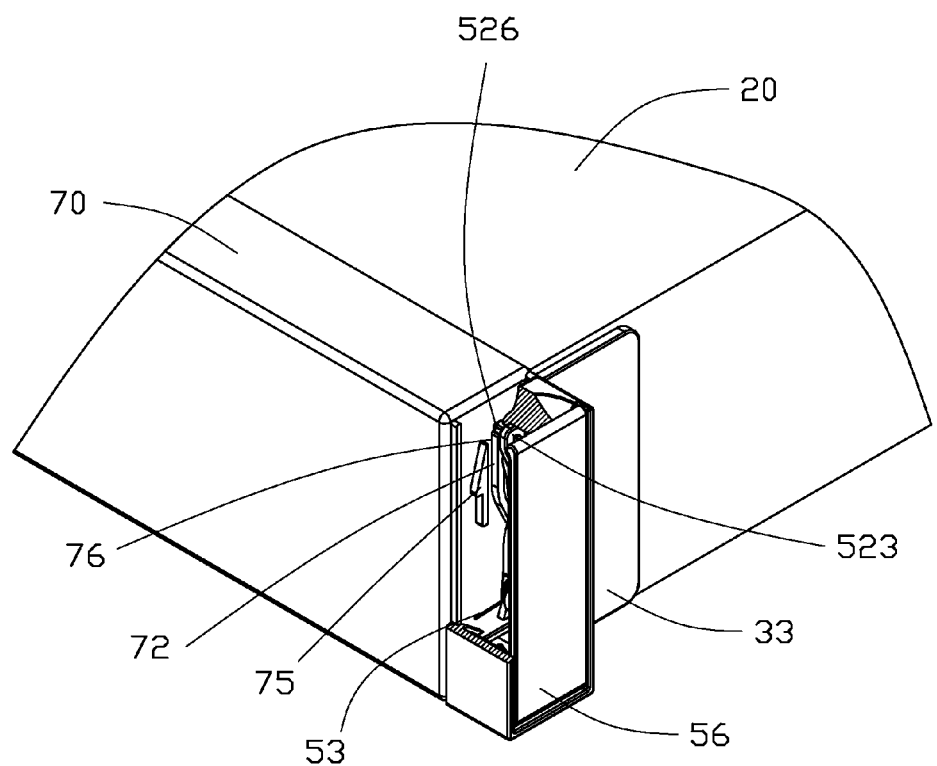

FIGS. 4-6 illustrate a process of assembling the panel 70 to the chassis 20. The bottom surface 713 of the panel 70 is first inserted into the installing space 35 from above the chassis 20. The guiding portions 723 slidably abut against the corresponding latching poles 526 to slide the latching poles 526 along the corresponding guiding slots 3312 away from the front wall 25 of the chassis 20 until the latching poles 526 are received in the corresponding sliding slots 76. Thus, the latching members 52 are rotated forward, and the first resilient members 53 are deformed. The panel 70 is pressed down, causing the latching poles 526 to slide further along the sliding slots 76, until each latching pole 526 exits out of a top end of the corresponding sliding slot 76. The first resilient members 53 are restored to bias the latching members 52 to rotate back, causing each latching pole 526 to engage with a top portion of the corresponding positioning portion 721. Thus, the bottom surface 713 of the panel 70 is located above the resisting plates 562 of the operating members 56, and the panel 70 is assembled between the receiving shells 33.

Figure 7:
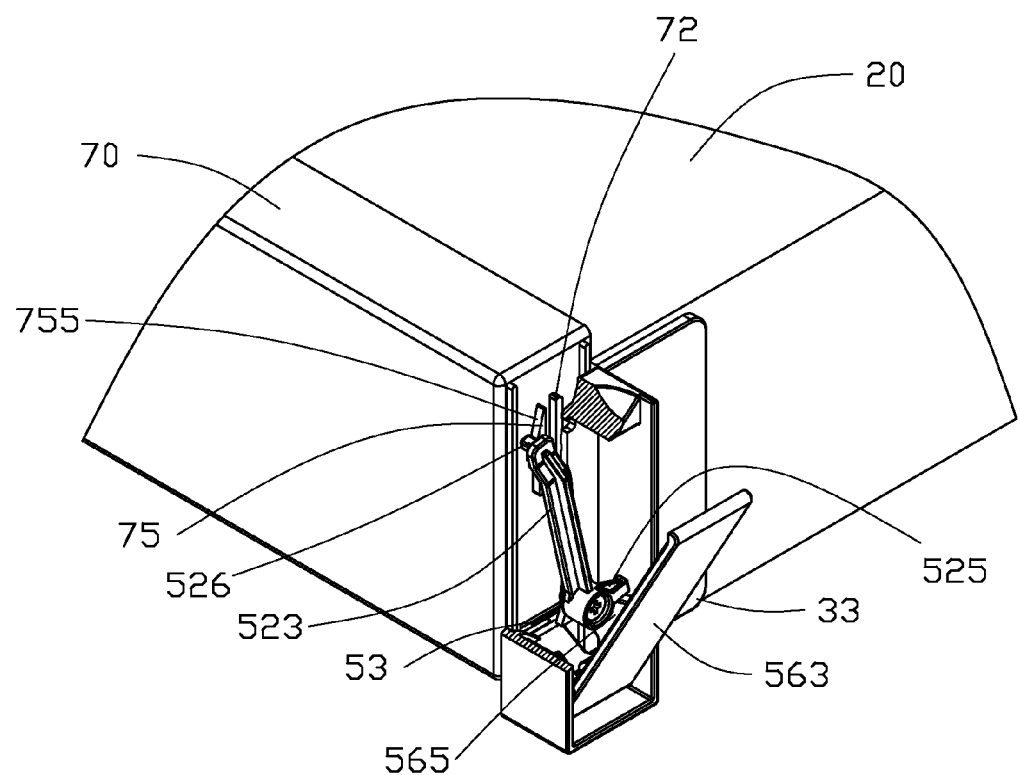
FIG. 7 and FIG. 8 are isometric, cutaway views showing a process of disassembling the electronic device.
Figure 8:
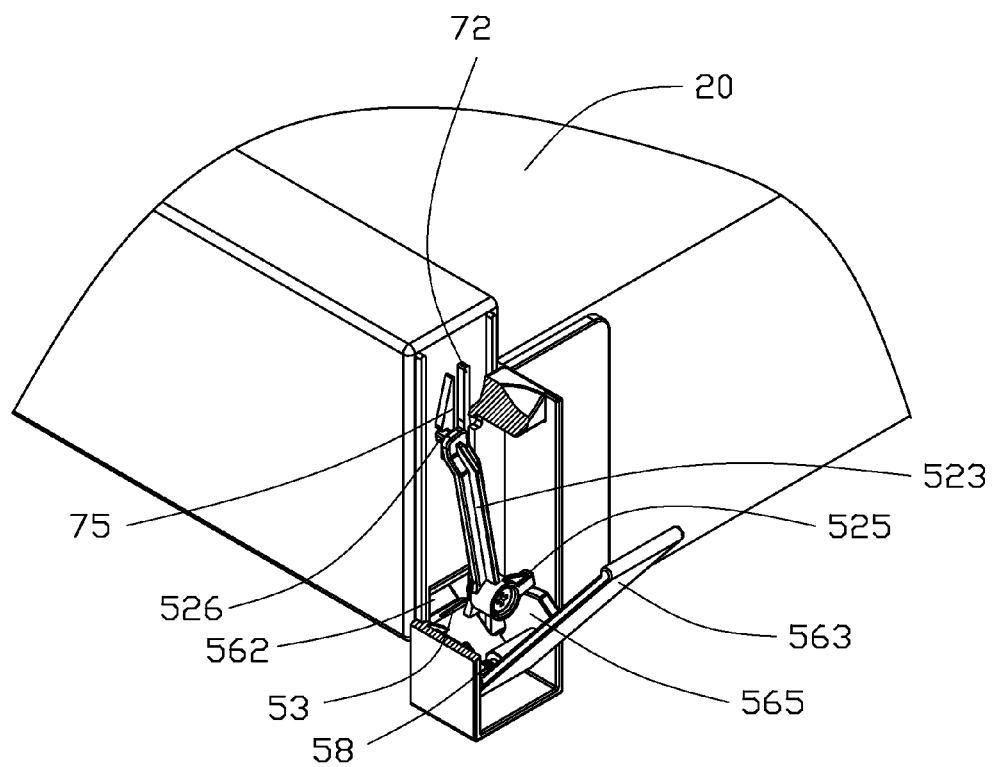

FIGS. 7-8 illustrate a process of disassembling the panel 70 from the chassis 20. The operating plates 563 are rotated away from the corresponding receiving shells 33 about the corresponding shafts 57, thereby causing the abutting pieces 565 of the operating members 56 to slidably abut against the adjusting plates 525 of the latching members 52. Thus, the latching members 52 are rotated toward the front surface 711 of the panel 70, thereby causing each latching pole 526 to disengage from the corresponding positioning portion 721 and slidably abut against the corresponding guiding surface 755. In this position, the resisting plates 562 abut against the bottom surface 713 of the panel 70, and the first resilient members 53 and the second resilient members 58 are deformed. The operating members 56 are further rotated away from the corresponding receiving shells 33, thereby causing the resisting plates 562 to lift up the panel 70. Thus, the latching poles 526 are slid along the corresponding guiding surfaces 755, thereby further deforming the first resilient members 53 and the second resilient members 58 until the latching poles 526 align with the corresponding abutting surfaces 756. The first resilient members 53 are partially restored to bias the latching members 52 to rotate back, until the latching poles 526 are latched to the corresponding abutting surfaces 756. Thus, the panel 70 is supported on the latching poles 526 of the latching members 52. The operating members 56 are released, the panel 70 can be detached from the receiving shells 33, and the first resilient members 53 and the second resilient members 54 are restored to rotate the operating members 56 toward the corresponding receiving shells 33 about the shafts 57, and rotate back the latching members 52.

Even though numerous characteristics and advantages of the embodiments have been set forth in the foregoing description, together with details of the structure and function of the embodiments, the present disclosure is illustrative only, and changes may be made in detail, including in the matters of shape, size, and arrangement of parts within the principles of the embodiments to the full extent indicated by the broad general meaning of the terms in which the appended claims are expressed.

What is claimed is:

1. An electronic device, comprising:
a chassis comprising two opposite side walls;
a panel comprising two latching bars protruding from two opposite ends of the panel;
two mounting brackets configured to mount at front ends of the side walls; and
two latching apparatuses configured to couple to the mounting brackets, wherein each latching apparatus comprises a latching member rotatable installed to the corresponding mounting bracket, a first resilient member configured to couple between the latching member and the mounting bracket to restore the latching member, and an operating member rotatable installed to the mounting bracket to push the latching member to rotate, each latching member comprises a latching pole configured to extend through the corresponding mounting bracket, the panel is configured to be assembled between the mounting brackets, the latching bars are configured to abut against the latching poles to rotate the latching members, and to deform the first resilient members, each latching pole is configured to slide along the corresponding latching bar, until the latching pole slides over the latching bar, the first resilient members are restored to urge the latching members to rotate back, until the latching poles are latched to the latching bars.

2. The electronic device of claim 1, wherein each operating member comprises an abutting piece, each latching member comprises an adjusting plate, the operating member is configured to rotate, the abutting piece is configured to abut against the adjusting plate, and the latching member is configured to rotate to urge the latching pole to disengage from the latching bar.

3. The electronic device of claim 2, wherein each operating member further comprises a resisting plate configured to extend through the corresponding mounting bracket below the panel and an operating plate configured to extend up from an end of the resisting plate, the operating plate is rotated, the abutting piece abuts against the adjusting plate, until the latching pole is disengaged from the latching bar, and the panel is pushed up by the resisting plate.

4. The electronic device of claim 3, wherein each mounting bracket comprises a receiving shell exposed out a front wall of the chassis, the receiving shell comprises a coupling plate and two side plates extending out from two opposite sides of the coupling plate, the coupling plate and the side plates cooperatively bound a receiving slot, each latching member is received in the corresponding receiving slot and rotatably coupled to the corresponding coupling plate, each operating member is received in the corresponding receiving slot and a bottom end of the operating member is rotatably coupled between the side plates, and the abutting piece of each operating member is located below the adjusting plate of the corresponding latching member.

5. The electronic device of claim 4, wherein each latching member further comprises a rotating portion rotatably coupled to the corresponding coupling plate and an extending pole extending out from a side of the rotating portion, and the latching pole protrudes from a distal end of the extending pole.

6. The electronic device of claim 5, wherein each receiving shell further comprises a connecting pole extending from the coupling plate toward the receiving slot, the first resilient member is fitted about the connecting pole, the rotating portion is rotatably coupled to the connecting pole, and the first resilient member is abutted between the receiving shell and the latching member.

7. The electronic device of claim 4, wherein each coupling plate defines a guiding slot in an upper portion of the coupling plate and a through hole in an lower portion of the coupling plate, the latching pole of each latching member extends through the corresponding guiding slot and slidable along the guiding slot, and the resisting plate of each operating member extends through the corresponding through hole below a bottom of the panel.

8. The electronic device of claim 3, wherein the panel further comprises two positioning bars protruding on two opposite ends of the panel, each positioning bar is located at a front of the corresponding latching bar, each positioning bar and the corresponding latching bar cooperatively bound a sliding slot, and each latching pole is configured to slide along the corresponding sliding slot and configured to be stopped at the top end of the latching bar.

9. The electronic device of claim 8, wherein each positioning bar comprises a connecting portion and a latching portion extending forward from an upper portion of the connecting portion, the operating member is rotated to urge each latching member to rotate, to urge the latching pole to disengage from the corresponding latching bar, the latching pole passes over the corresponding sliding slot and the latching portion, the panel is moved up, until the latching pole is latched a bottom of the latching portion, and the panel is supported on the latching members.

10. The electronic device of claim 9, wherein a front of each latching portion defines a guiding surface, each latching pole is configured to slide along the corresponding guiding surface, until the latching pole is configured to latch the bottom of the latching portion.

11. The electronic device of claim 1, wherein each latching bar comprises a positioning portion and a guiding portion slantingly extending down from a bottom end of the positioning portion, the panel is configured to insert between the mounting brackets, and the guiding portion abuts against the corresponding latching pole to rotate the latching member.

12. The electronic device of claim 1, wherein each latching apparatus further comprises a second resilient member configured to be coupled between the operating member and the mounting bracket to restore the operating member.

13. An electronic device comprising:
a chassis comprising two opposite side walls each having a front end;
a panel having two opposite ends and comprising two latching bars each protruding from one of two opposite ends;
two mounting brackets each configured to be coupled at one of the front ends of the two opposite side walls; and
two latching apparatus each configured to coupled to one of the mounting brackets, wherein each latching apparatus comprises:
a latching member rotatably installed on a corresponding mounting bracket of the two mounting brackets and comprising a latching pole configured to extend through the corresponding mounting bracket, the latching pole is configured to slide along a corresponding one of the two latching bars until the latching pole slides over the corresponding latching bar,
a first resilient member configured to couple the latching member and the corresponding mounting bracket and to return the latching member to an initial configuration, and
an operating member rotatably installed on the corresponding mounting brackets to cause the latching member to rotate;
wherein the panel is configured to be coupled between the two mounting brackets;
wherein each of the latching bars is configured to abut against the latching pole to rotate the latching members and to deform the first resilient member and the first resilient member is configured to urge the latching members to rotate back to the initial configuration until the latching pole is latched to the latching bar.

14. The electronic device of claim 13, wherein the operating member comprises an abutting piece, the latching member comprises an adjusting plate, the operating member is configured to rotate, the abutting piece is configured to abut against the adjusting plate, and the latching member is configured to rotate to urge the latching pole to disengage from the latching bar.

15. The electronic device of claim 14, wherein the operating member further comprises a resisting plate configured to extend through the corresponding mounting bracket below the panel and an operating plate configured to extend up from an end of the resisting plate, the operating plate is rotated, the abutting piece abuts against the adjusting plate, until the latching pole is disengaged from the latching bar, and the panel is pushed up by the resisting plate.

16. The electronic device of claim 15, wherein the mounting bracket comprises a receiving shell exposed out the front end of the corresponding side wall of the chassis, the receiving shell comprises a coupling plate and two side plates extending out from two opposite sides of the coupling plate, the coupling plate and the side plates cooperatively bound a receiving slot, the latching member is received in the receiving slot and rotatably coupled to the coupling plate, each operating member is received in the receiving slot and a bottom end of the operating member is rotatably coupled between the side plates, and the abutting piece of the operating member is located below the adjusting plate of the latching member.

17. The electronic device of claim 16, wherein the latching member further comprises a rotating portion rotatably coupled to the coupling plate and an extending pole extending out from a side of the rotating portion, and the latching pole protrudes from a distal end of the extending pole.

18. The electronic device of claim 17, wherein the receiving shell further comprises a connecting pole extending from the coupling plate toward the receiving slot, the first resilient member is fitted about the connecting pole, the rotating portion is rotatably coupled to the connecting pole, and the first resilient member is abutted between the receiving shell and the latching member.

19. The electronic device of claim 16, wherein the coupling plate defines a guiding slot in an upper portion of the coupling plate and a through hole in an lower portion of the coupling plate, the latching pole of the latching member extends through the guiding slot and slidable along the guiding slot, and the resisting plate of the operating member extends through the through hole below a bottom of the panel.

20. The electronic device of claim 15, wherein the panel further comprises two positioning bars protruding on the two opposite ends of the panel, the positioning bar is located at a front of the corresponding latching bar, the positioning bar and the corresponding latching bar cooperatively bound a sliding slot, and the latching pole is configured to slide along the corresponding sliding slot and configured to be stopped at the top end of the latching bar.

\* \* \* \* \*